(12) United States Patent
Eid et al.

(10) Patent No.: US 12,080,620 B2
(45) Date of Patent: Sep. 3, 2024

(54) ADDITIVELY MANUFACTURED STRUCTURES FOR HEAT DISSIPATION FROM INTEGRATED CIRCUIT DEVICES

(71) Applicant: Intel Corporation, Santa Clara, CA (US)

(72) Inventors: Feras Eid, Chandler, AZ (US); Xavier Brun, Hillsboro, OR (US); Paul Diglio, Gaston, OR (US); Joe Walczyk, Tigard, OR (US); Sergio Antonio Chan Arguedas, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 845 days.

(21) Appl. No.: 16/912,432

(22) Filed: Jun. 25, 2020

(65) Prior Publication Data
US 2021/0407884 A1    Dec. 30, 2021

(51) Int. Cl.
*H01L 23/373*    (2006.01)
*B33Y 70/00*    (2020.01)
*B33Y 80/00*    (2015.01)

(52) U.S. Cl.
CPC .......... *H01L 23/3735* (2013.01); *B33Y 70/00* (2014.12); *B33Y 80/00* (2014.12)

(58) Field of Classification Search
CPC ....... H01L 23/00; H01L 23/053; H01L 23/06; H01L 23/10; H01L 23/16; H01L 23/3157; H01L 23/3677; H01L 23/3737; H01L 23/373; H01L 23/3732; H01L 23/3733; H01L 23/3735; H01L 23/3738; H01L 23/38; H01L 23/42; H01L 23/427; H01L 23/433; H01L 23/473; H01L 23/381; H01L 23/4981; H01L 23/49816; H01L 23/49822; H01L 23/49833; H01L 23/49838; H01L 23/49894; H01L 23/5226; H01L 23/5383; H01L 23/5386; H01L 23/544; H01L 23/562; H01L 23/66; H01L 2224/32245; H01L 2224/08225; H01L 2224/32225;
(Continued)

(56) References Cited

U.S. PATENT DOCUMENTS 5,031,029 A * 7/1991 Acocella ............. H01L 23/3735
165/905
6,281,106 B1 * 8/2001 Higdon ................ H05K 3/3436
257/E21.511

(Continued)

*Primary Examiner* — Amir A Jalali
(74) *Attorney, Agent, or Firm* — Essential Patents Group, LLP

(57) ABSTRACT

An integrated circuit assembly may be fabricated to include an integrated circuit device having a backside surface and a backside metallization layer on the backside surface of the integrated circuit device, wherein the backside metallization layer comprises a bond layer on the backside surface of the integrated circuit device, a high thermal conductivity layer on the bond layer, and a cap layer on the high thermal conductivity layer. The bond layer may be a layered stack comprising an adhesion promotion layer on the backside of the integrated circuit device and at one least metal layer. The high thermal conductivity layer may be an additively deposited material having a thermal conductivity greater than silicon, such as copper, silver, aluminum, diamond, silicon carbide, boron nitride, aluminum nitride, and combinations thereof.

21 Claims, 5 Drawing Sheets

(58) Field of Classification Search
CPC .............. H05K 7/2039; H05K 7/20454; H05K 7/20463; H05K 7/20472; H05K 7/205; H05K 7/20263; H05K 7/20281; H05K 7/20309; H05K 7/20318; H05K 7/20409; H05K 7/2089–209; H05K 1/0201–0212; H05K 1/021; H05K 1/0233; H05K 1/029; H05K 1/032; H05K 1/165; H05K 1/185; H05K 2201/06–068; H05K 2201/10416
See application file for complete search history.

(56) References Cited

U.S. PATENT DOCUMENTS

| | | | | |
|---|---|---|---|---|
| 2002/0074649 | A1* | 6/2002 | Chrysler | H01L 21/049 |
| | | | | 257/E23.101 |
| 2002/0141155 | A1* | 10/2002 | Pinneo | H01L 23/3732 |
| | | | | 361/688 |
| 2006/0258054 | A1* | 11/2006 | Pan | H01L 21/4871 |
| | | | | 174/548 |
| 2007/0004216 | A1* | 1/2007 | Hu | H01L 23/3732 |
| | | | | 257/E23.103 |
| 2007/0116626 | A1* | 5/2007 | Pan | H01L 23/373 |
| | | | | 257/E23.11 |
| 2014/0193658 | A1* | 7/2014 | Ross | H01L 24/83 |
| | | | | 228/179.1 |
| 2015/0130045 | A1* | 5/2015 | Tseng | H01L 25/0652 |
| | | | | 438/122 |
| 2017/0317029 | A1* | 11/2017 | Hsieh | H01L 25/105 |

* cited by examiner

ADDITIVELY MANUFACTURED STRUCTURES FOR HEAT DISSIPATION FROM INTEGRATED CIRCUIT DEVICES

TECHNICAL FIELD

Embodiments of the present description generally relate to the removal of heat from integrated circuit devices, and, more particularly, to thermal management solutions wherein an additively manufactured metallization layer is formed between at least one integrated circuit device and a heat dissipation device.

BACKGROUND

The integrated circuit industry is continually striving to produce ever faster, smaller, and thinner integrated circuit (IC) devices and packages for use in various electronic products, including, but not limited to, computer servers and portable products, such as portable computers, electronic tablets, cellular phones, digital cameras, and the like.

As these goals are achieved, the integrated circuit devices become smaller. Accordingly, the density of power consumption of electronic components within the integrated circuit devices has increased, which, in turn, increases the average junction temperature of the integrated circuit device. If the temperature of the integrated circuit device becomes too high, the integrated circuits may be damaged or destroyed. Thus, heat dissipation devices are used to remove heat from the integrated circuit devices in an integrated circuit package. In one example, at least one integrated circuit device may be mounted to an electronic substrate and the heat dissipation device may be thermally attached to the at least one integrated circuit device with a thermal interface material ("TIM") that is disposed between the integrated circuit device(s) and the heat dissipation device to form thermal contact therebetween. The thermal interface material may include thermal greases, gap pads, polymers, and the like.

Since the thermal interface material provides a heat transfer path from the integrated circuit device(s) to the heat dissipation device, the thermal efficiency of the thermal interface material is critical to effectively remove heat from the integrated circuit device(s). Thus, the thermal interface material should have a thermal conductivity that is higher than the primary material of the integrated circuit device(s), such as silicon. However, even the best thermal interface materials, such as indium-containing materials, have thermal conductivities that are lower than silicon.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

Figure 1:
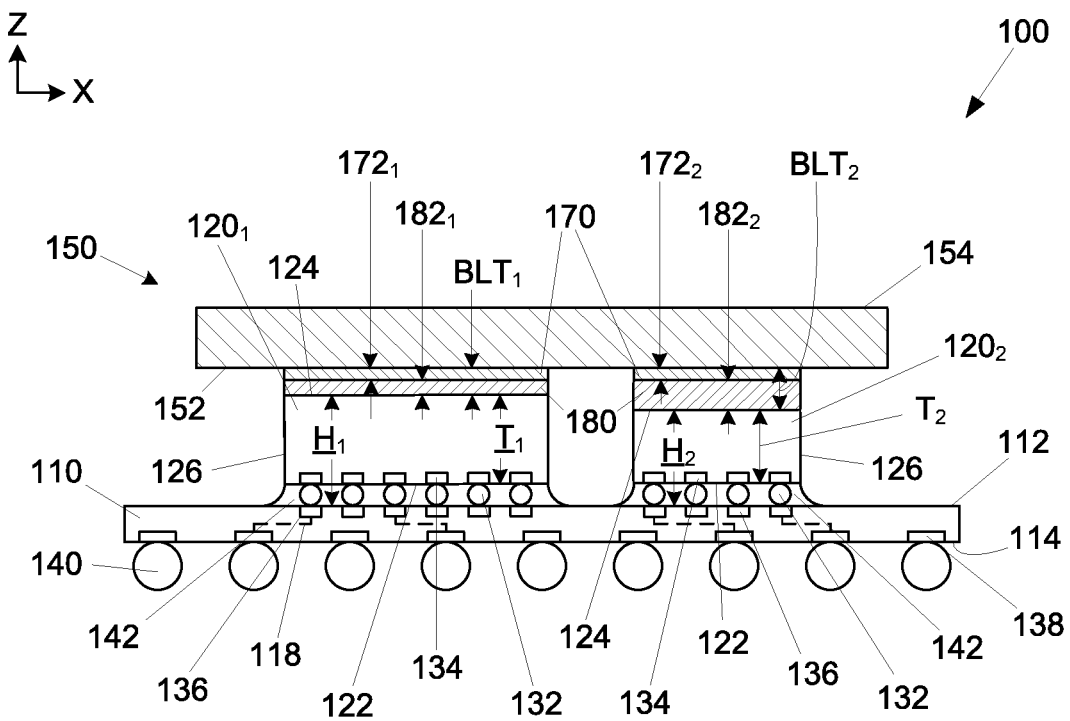
FIG. 1 is a side cross-sectional view of an integrated circuit assembly, according to one embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The term "package" generally refers to a self-contained carrier of one or more dice, where the dice are attached to the package substrate, and may be encapsulated for protection, with integrated or wire-bonded interconnects between the dice and leads, pins or bumps located on the external portions of the package substrate. The package may contain a single die, or multiple dice, providing a specific function. The package is usually mounted on a printed circuit board for interconnection with other packaged integrated circuits and discrete components, forming a larger circuit.

Here, the term "cored" generally refers to a substrate of an integrated circuit package built upon a board, card or wafer comprising a non-flexible stiff material. Typically, a small printed circuit board is used as a core, upon which integrated circuit device and discrete passive components may be soldered. Typically, the core has vias extending from one side to the other, allowing circuitry on one side of the core to be coupled directly to circuitry on the opposite side of the core. The core may also serve as a platform for building up layers of conductors and dielectric materials.

Here, the term "coreless" generally refers to a substrate of an integrated circuit package having no core. The lack of a core allows for higher-density package architectures, as the through-vias have relatively large dimensions and pitch compared to high-density interconnects.

Here, the term "land side", if used herein, generally refers to the side of the substrate of the integrated circuit package closest to the plane of attachment to a printed circuit board, motherboard, or other package. This is in contrast to the term "die side", which is the side of the substrate of the integrated circuit package to which the die or dice are attached.

Here, the term "dielectric" generally refers to any number of non-electrically conductive materials that make up the structure of a package substrate. For purposes of this disclosure, dielectric material may be incorporated into an integrated circuit package as layers of laminate film or as a resin molded over integrated circuit dice mounted on the substrate.

Here, the term "metallization" generally refers to metal layers formed over and through the dielectric material of the package substrate. The metal layers are generally patterned to form metal structures such as traces and bond pads. The metallization of a package substrate may be confined to a single layer or in multiple layers separated by layers of dielectric.

Here, the term "bond pad" generally refers to metallization structures that terminate integrated traces and vias in integrated circuit packages and dies. The term "solder pad" may be occasionally substituted for "bond pad" and carries the same meaning.

Here, the term "solder bump" generally refers to a solder layer formed on a bond pad.

The solder layer typically has a round shape, hence the term "solder bump".

Here, the term "substrate" generally refers to a planar platform comprising dielectric and metallization structures. The substrate mechanically supports and electrically couples one or more IC dies on a single platform, with encapsulation of the one or more IC dies by a moldable dielectric material. The substrate generally comprises solder bumps as bonding interconnects on both sides. One side of the substrate, generally referred to as the "die side", comprises solder bumps for chip or die bonding. The opposite side of the substrate, generally referred to as the "land side", comprises solder bumps for bonding the package to a printed circuit board.

Here, the term "assembly" generally refers to a grouping of parts into a single functional unit. The parts may be separate and are mechanically assembled into a functional unit, where the parts may be removable. In another instance, the parts may be permanently bonded together. In some instances, the parts are integrated together.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, magnetic or fluidic connection between the things that are connected or an indirect connection, through one or more passive or active intermediary devices.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects to which are being referred and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional", "profile" and "plan" correspond to orthogonal planes within a cartesian coordinate system. Thus, cross-sectional and profile views are taken in the x-z plane, and plan views are taken in the x-y plane. Typically, profile views in the x-z plane are cross-sectional views. Where appropriate, drawings are labeled with axes to indicate the orientation of the figure.

Embodiments of the present description relate to the formation of an additively manufactured metallization layer on a backside surface of an integrated circuit device, wherein the metallization layer has a thermal conductivity that is greater than that of the integrated circuit device. In one embodiment an integrated circuit assembly may be fabricated to include the integrated circuit device having the backside surface and the metallization layer on the backside surface of the integrated circuit device, wherein the metallization layer comprises a bond layer on the backside surface of the integrated circuit device, a high thermal conductivity layer on the bond layer, and a cap layer on the high thermal conductivity layer. The bond layer may be a layered stack comprising an adhesion promotion layer on the backside of the integrated circuit device and at least one metal layer on the adhesion promotion layer. The high thermal conductivity layer may be an additively deposited material having a thermal conductivity greater than that of silicon, such as copper, silver, aluminum, diamond, silicon carbide, boron nitride, aluminum nitride, and combinations thereof.

FIG. 1 illustrates an integrated circuit assembly 100 having at least one integrated circuit device (illustrated as a first integrated circuit device 120₁ and a second integrated circuit device 120₂) electrically attached to an electronic substrate 110 in a configuration generally known as a flip-chip or controlled collapse chip connection ("C4") configuration, according to an embodiment of the present description.

The electronic substrate 110 may be any appropriate structure, including, but not limited to, an interposer. The electronic substrate 110 may have a first surface 112 and an opposing second surface 114. The electronic substrate 110 may comprise a plurality of dielectric material layers (not shown), which may include build-up films and/or solder resist layers, and may be composed of an appropriate dielectric material, including, but not limited to, bismaleimide triazine resin, fire retardant grade 4 material, polyimide material, silica filled epoxy material, glass reinforced epoxy material, and the like, as well as low-k and ultra low-k dielectrics (dielectric constants less than about 3.6), including, but not limited to, carbon doped dielectrics, fluorine doped dielectrics, porous dielectrics, organic polymeric dielectrics, and the like.

The electronic substrate 110 may further include conductive routes 118 (shown in dashed lines) extending through the electronic substrate 110. As will be understood to those skilled in the art, the conductive routes 118 may be a combination of conductive traces (not shown) and conductive vias (not shown) extending through the plurality of dielectric material layers (not shown). These conductive traces and conductive vias are well known in the art and are not shown in FIG. 1 for purposes of clarity and conciseness. The conductive traces and the conductive vias may be made of any appropriate conductive material, including but not limited to, metals, such as copper, silver, nickel, gold, and aluminum, alloys thereof, and the like. As will be understood to those skilled in the art, the electronic substrate 110 may be a cored substrate or a coreless substrate. In one embodiment of the present description, the electronic substrate 110 may comprise a silicon or glass interposer. In another embodiment of the present description, the electronic substrate 110 may include active and/or passive devices.

The first integrated circuit device 120₁ and the second integrated circuit device 120₂ may be any appropriate device, including, but not limited to, a microprocessor, a chipset, a graphics device, a wireless device, a memory device, an application specific integrated circuit, combinations thereof, stacks thereof, or the like. Furthermore, the first integrated circuit device 120₁ and the second integrated circuit device 120₂ may be a monolithic die or a die stack that can consist of two or more vertical levels of dice stacked on top of each other, and may include additional materials, such as a mold compound, between at least two of the dice. As shown, the first integrated circuit device 120₁ and the second integrated circuit device 120₂ may each have a frontside surface 122, an opposing backside surface 124, and at least one side 126 extending between the frontside surface 122 and the backside surface 124.

In one embodiment of the present description, a metallization layer 180 may be formed on the backside surface 124 of the first integrated circuit device 120₁ and the second integrated circuit device 120₂, as will be discussed.

In an embodiment of the present description, the first integrated circuit device 120₁ and the second integrated circuit device 120₂ may be electrically attached to the electronic substrate 110 with a plurality of device-to-substrate interconnects 132. In one embodiment of the present description, the device-to-substrate interconnects 132 may extend between bond pads 136 on the first surface 112 of the electronic substrate 110 and bond pads 134 on the frontside surface 122 of the first integrated circuit device 120₁ and on the frontside surface 122 of the second integrated circuit device 120₂. The device-to-substrate interconnects 132 may be any appropriate electrically conductive material or structure, including, but not limited to, solder balls, metal bumps or pillars, metal filled epoxies, or a combination thereof. In one embodiment, the device-to-substrate interconnects 132 may be solder balls formed from tin, lead/tin alloys (for example, 63% tin/37% lead solder), and high tin content alloys (e.g. 90% or more tin—such as tin/bismuth, eutectic tin/silver, ternary tin/silver/copper, eutectic tin/copper, and similar alloys). In another embodiment, the device-to-substrate interconnects 132 may be copper bumps or pillars. In a further embodiment, the device-to-substrate interconnects 132 may be metal bumps or pillars coated with a solder material. In still a further embodiment, the device-to-substrate interconnects 132 may be anisotropic conductive film.

The bond pads 134 may be in electrical communication with integrated circuitry (not shown) within their respective integrated circuit devices, i.e. the first integrated circuit device 120₁ and the second integrated circuit device 120₂. The bond pads 136 on the first surface 112 of the electronic substrate 110 may be in electrical contact with the conductive routes 118. The conductive routes 118 may extend through the electronic substrate 110 and be connected to bond pads 138 on the second surface 114 of the electronic substrate 110. As will be understood to those skilled in the art, the electronic substrate 110 may reroute a fine pitch (center-to-center distance between the bond pads) of the integrated circuit device bond pads 136 to a relatively wider pitch of the bond pads 138 on the second surface 114 of the electronic substrate 110. In one embodiment of the present description, external interconnects 140 may be disposed on the bond pads 138 on the second surface 114 of the electronic substrate 110. The external interconnects 140 may be any appropriate electrically conductive material, such as those discussed with regard to the device-to-substrate interconnects 132, as previously discussed. The external interconnects 140 may be used to attach the integrated circuit assembly 100 to an external substrate (not shown), such as a motherboard.

An electrically-insulating underfill material 142, such as an epoxy material, may be disposed between the first integrated circuit device 120₁ and the electronic substrate 110, and between the second integrated circuit device 120₂ and the electronic substrate 110. The underfill material 142 may be used to overcome the mechanical stress issues that can arise from thermal expansion mismatch between the electronic substrate 110 and the integrated circuit devices 120₁ and 120₂. As will be understood to those skilled in the art, the underfill material 142 may be dispensed between the frontside surface 122 of the integrated circuit devices 120₁, 120₂, respectively, and the electronic substrate 110 as a viscous liquid and then hardened with a curing process.

As further shown in FIG. 1, the integrated circuit assembly 100 may further include a heat dissipation device 150 having a thermal contact surface 152 that is thermally coupled with the backside surface 124 of the first integrated circuit device 120₁ and the backside surface 124 of the second integrated circuit device 120₂ with a thermal interface material 180. The heat dissipation device 150 may be a heat pipe, a vapor chamber, a liquid cooling device, a cold plate, and the like. In one embodiment, the heat dissipation device 150 may be made of any appropriate thermally conductive material, including, but not limited to at least one metal material and alloys of more than one metal, or highly doped glass or highly conductive ceramic material, such as aluminum nitride. In a specific embodiment of the present description, the heat dissipation device 150 may comprise copper, nickel, aluminum, alloys thereof, laminated metals including coated materials (such as nickel coated copper), and the like. When the heat dissipation device 150 is a cold plate, at least one additional thermal management device (not shown) may be attached to an exterior surface 154 of the heat dissipation device 150 to enhance heat removal. Such additional thermal management devices may include, but are not limited to, heat pipes, high surface area dissipation structures with a fan (such as a structure having fins or pillars/columns formed in a thermally conductive structure), liquid cooling devices, and the like.

As will be understood, when multiple integrated circuit devices are utilized, they may have different thicknesses. For example, as shown in FIG. 1, the first integrated circuit device $120_1$ and the second integrated circuit device $120_2$ may have differing thicknesses $T_1$ and $T_2$, respectively, that are measured from the frontside surface 122 to the backside surface 124 of the first integrated circuit device $120_1$ and the second integrated circuit device $120_2$, respectively. The differing thicknesses $T_1$ and $T_2$ may result in differing heights $H_1$ and $H_2$ between the first integrated circuit device $120_1$ and the second integrated circuit device $120_2$, respectively, that are measured from the first surface 112 of the electronic substrate 110 to the backside surface 124 of each of the first integrated circuit device $120_1$ and the second integrated circuit device $120_2$, which may result in differing bond line thickness $BLT_1$ and $BLT_2$, respectively. As further illustrated, a thickness $182_1$ of the metallization layer 180 on the first integrated circuit device $120_1$ may be less than a thickness $182_2$ of the metallization layer 180 on the second integrated circuit device $120_2$ to compensate for the differing heights $H_1$ and $H_2$ between the first integrated circuit device $120_1$ and the second integrated circuit device $120_2$, when the thickness $172_1$ for the thermal interface material 170 on the first integrated circuit device $120_1$ is substantially equal to a thickness $172_2$ of the thermal interface material 170 on the second integrated circuit device $120_2$.

In various embodiments of the present description, the thermal interface material 170 may be any appropriate, thermally conductive material, including, but not limited to, a thermal grease, a thermal gap pad, a polymer, an epoxy filled with high thermal conductivity fillers, such as metal particles or silicon particles, and the like. In one embodiment of the present description, the thermal interface material 170 may be a phase change material. A phase change material is a substance with a high heat of fusion, which, when it melts and solidifies, is capable of storing and releasing large amounts of thermal energy. In an embodiment of the present description, the phase change material may include, but not limited to, nonadecane, decanoic (capric) acid, eicosane, dodecanoic (lauric) acid, docosane, paraffin wax, stearic acid, tetradecanoic (myristic) acid, octadecanol, hexadecanoic (palmitic) acid, and metallic alloys which include one or more of bismuth, lead, tin, cadmium, antimony, indium, thallium, tellurium, selenium, gallium, mercury, and combinations thereof.

Figure 2:
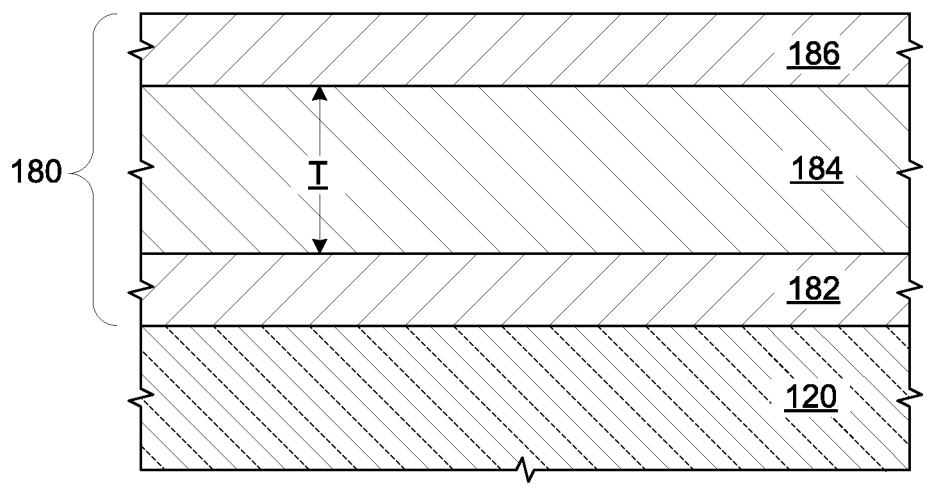
FIG. 2 is a side cross-sectional view of a metallization layer on a backside surface of an integrated circuit device, according to an embodiment of the present description.

As shown in FIG. 2, the metallization layer 180 may comprise multiple layers, which are illustrated as a bond layer 182, a high thermal conductivity layer 184, and a cap layer 186 on an integrated circuit device 120. It is understood that the bond layer 182, the high thermal conductivity layer 184, and the cap layer 186 may each consist of multiple materials that are deposited simultaneously (e.g. an alloy or hybrid of two or more metals that are co-deposited) or sequentially (e.g. consecutive sublayers of different materials).

In an embodiment of the present description, the bond layer 182 may be utilized to assist in the adhesion of the high thermal conductivity layer 184 and/or act as a barrier layer to prevent diffusion of the high thermal conductivity layer 184 into the integrated circuit device 120.

In one embodiment of the present description, the high thermal conductivity layer 184 may have a thermal conductivity greater than the integrated circuit device 120. In another embodiment of the present description, the high thermal conductivity layer 184 may comprise at least one of copper, silver, aluminum, diamond, silicon carbide, boron nitride, aluminum nitride, and combinations thereof. In a further embodiment of the present description, the high thermal conductivity layer 184 may have a thermal conductivity of greater than about 150 W/m*K. In an embodiment of the present description, the high thermal conductivity layer 184 may have a thickness T of between about 50 and 500 microns. The high thermal conductivity layer 184 may be used to spread heat for localized hot spots, as will be understood to those skilled in the art, or to compensate for height mismatches between various integrated circuit devices in a multichip assembly, as previously discussed.

The high thermal conductivity layer 184 may be formed by an additive process, such as high throughput additive manufacturing ("HTAM"). In one embodiment, the high thermal conductivity layer 184 may be formed with a "coldspray" HTAM process. As the coldspray process is known in the art, it will not be illustrated, but rather merely discussed herein. With a coldspray process, solid powders of a desired material or materials to be deposited are accelerated in a carrier jet (e.g. compressed air or nitrogen) by passing the jet through a converging diverging nozzle. The jet exits the nozzle at a high velocity and reaches the underlying substrate (e.g. the bond layer 182), where the impact causes the solid particles in the jet to plastically deform and bond to the substrate. Subsequent layers of the material similarly adhere to each underlying layer upon continued jet impact, producing fast buildup (e.g. layers that are a few hundred microns thick can be deposited over an area of about 100-1000 mm$^2$ in a few seconds). Moreover, unlike thermal spraying techniques, this approach does not require melting the particles, thus protecting both the powders and the substrate from experiencing excessive processing temperatures. Because additive manufacturing, such as coldspray, is used, it eliminates the need for using lithography and the many steps associated with it (resist deposition, exposure, resist development, and resist removal) that are characteristic of subtractive or semi-additive methods, such as plating, sputtering, and the like. Additionally, 3D topography can be easily created, if needed, as will be understood to those skilled in the art. Moreover, different materials can be combined in the feed powder and used to create hybrid features in one step. As will be understood to those skilled in the art, the coldspray process is abrasive, which may damage the integrated circuit device 120, if the high thermal conductivity layer 184 were coldsprayed directly on the integrated circuit device 120. Thus, the bond layer 182 may protect the integrated circuit device 120 from such abrasion.

The high thermal conductivity layer 184 may be susceptible to oxidation and/or corrosion over time. Thus, the cap layer 186 may be deposited on the high thermal conductivity layer 184 to protect against those risks. The cap layer 186 may be formed by any known process, including, but not limited to coldspray, chemical vapor deposition, physical vapor deposition, and the like. In one embodiment, the cap layer 186 may be any appropriate material, including, but not limited to, nickel, aluminum, silver, tungsten, vanadium, gold, titanium, and alloys thereof. In a further embodiment, the cap layer 186 may have a thickness between about 100 nanometers and 10 microns.

The embodiment illustrated in FIG. 2 may help spread heat from the integrated circuit device 120 as close as possible to the heat source, before the heat reaches thermal bottleneck layers, such as the thermal interface material 170, and to reduce the impact of thermal resistance from additional components (not shown). In one embodiment, the high thermal conductivity layer 184 may be the thickest layer within the metallization layer 180.

In one embodiment of the present description, the bond layer 182 may be a single layer. In a specific embodiment, the bond layer 182 may be comprise a single layer of titanium.

Figure 3:
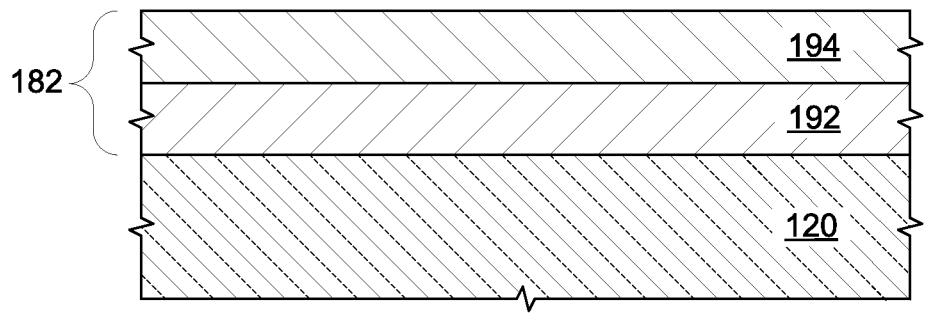
FIGS. 3-5 are side cross-sectional views of a bond layer of a metallization layer on a backside surface of an integrated circuit device, according to various embodiments of the present description.

As shown in FIG. 3, the bond layer 182 may be a layered stack comprising an adhesion promotion layer 192 on the integrated circuit device 120 and at least one metal layer, such as first metal layer 194, on the adhesion promotion layer 192. The adhesion promotion layer 192, of course, promotes the adhesion of the first metal layer 194 to the integrated circuit device 120, and the first metal layer 194 may act as a barrier layer to prevent diffusion of the high thermal conductivity layer 184 into the integrated circuit device 120 and/or protect the integrated circuit device 120 from abrasion from a coldspray process. In one embodiment, the adhesion promotion layer 192 may be silicon nitride. In another embodiment, the first metal layer may be either titanium or a nickel/vanadium alloy.

Figure 4:
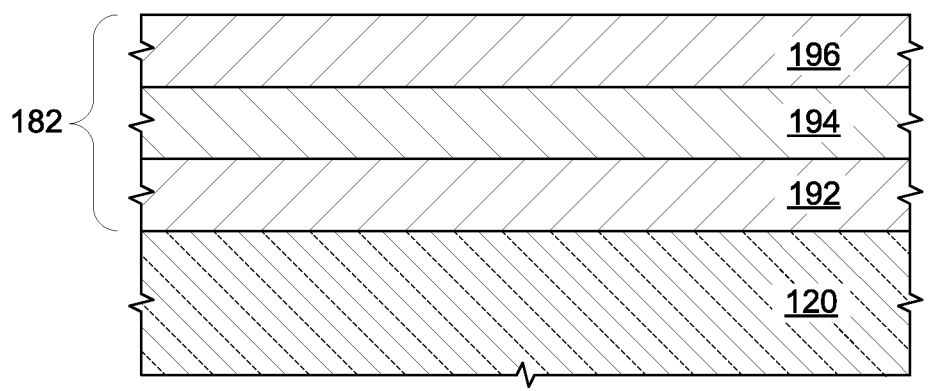

In a further embodiment shown in FIG. 4, the bond layer 182 may include the adhesion promotion layer 192 on the integrated circuit device 120, the first metal layer 194 on the adhesion promotion layer 192, and a second metal layer 196 on the first metal layer 194. In one embodiment, the first metal layer 194 may be titanium and the second metal layer may be gold, silver, or a nickel/vanadium alloy.

Figure 5:
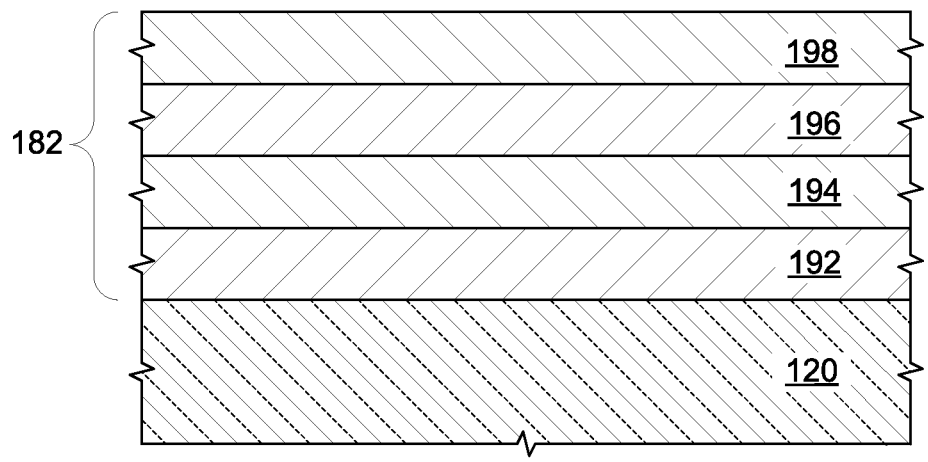

In another embodiment shown in FIG. 5, the bond layer 182 may include the adhesion promotion layer 192 on the integrated circuit device 120, the first metal layer 194 on the adhesion promotion layer 192, the second metal layer 196 on the first metal layer 194, and a third metal layer 198 on the second metal layer 196. In one embodiment, the first metal layer 194 may be titanium, the second metal layer may be a nickel/vanadium alloy, and the third metal layer may be gold or silver.

In the embodiment illustrated in FIG. 3-5, titanium and/or nickel/vanadium alloy of the first metal layer 194 and/or the second metal layer 196 may act as diffusion barriers. In other embodiments, gettering can be used to supplement or replace some of those layers in preventing diffusion of the high thermal conductivity layer 184 into the integrated circuit device 120. Gettering is the process of forming very thin regions (gettering sites) on the backside surface 124 (see FIG. 1) of the integrated circuit device 120 (such as a silicon wafer) to trap impurities and prevent them from diffusing to the frontside surface 122 (see FIG. 1) of the integrated circuit device 120, where integrated circuits (not shown), such as transistor devices, are formed. Those regions typically consist of crystal-damaged zones formed on the wafer backside by using special grinding and/or polishing steps such as polygrind or gettering dry polish, as will be understood to those skilled in the art.

Figure 6:
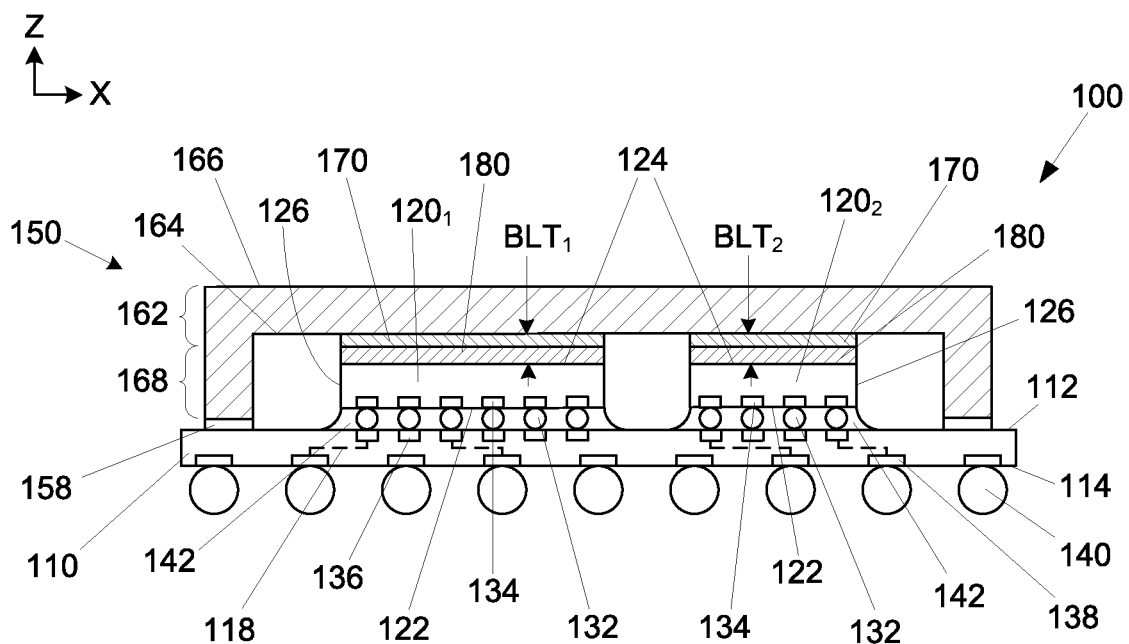
FIG. 6 is a side cross-sectional view of an integrated circuit assembly, according to another embodiment of the present description.

Although the heat dissipation device 150 of FIG. 1 is illustrated as a substantially planar structure, the embodiments of the present description are not so limited, and may be any appropriate configuration. For example, the heat dissipation device 150 may be an integrated heat spreader, as shown in FIG. 6. In one embodiment of the present description, the heat dissipation device 150 may comprise a main body 162, having a thermal contact surface 164 and an opposing surface 166, and at least one boundary wall 168 extending from the thermal contact surface 164 of the main body 162 of the heat dissipation device 150. The at least one boundary wall 168 may be attached or sealed to the first surface 112 of the electronic substrate 110 with an attachment adhesive or sealant layer 158.

As illustrated in FIG. 6, the heat dissipation device 150 may be a single material throughout, such as when the heat dissipation device 150 including the heat dissipation boundary wall 168 is formed by a single process step, including but not limited to, stamping, skiving, molding, and the like. However, embodiments of the present description may also include heat dissipation device 150 being made of more than one component. For example, the heat dissipation device boundary wall 168 may be formed separately from the main body 162, then attached together to form the heat dissipation device 150. In one embodiment, the boundary wall 168 may be a single "picture frame" structure surrounding the first integrated circuit device 120$_1$ and the second integrated circuit device 120$_2$.

The attachment adhesive 158 may be any appropriate material, including, but not limited to, silicones (such as polydimethylsiloxane), epoxies, and the like. It is understood that the boundary wall 168 not only secures the heat dissipation device 150 to the substrate 110, but also maintains a desired distance (e.g. bond line thickness $BLT_1$ and $BLT_2$) between the first surface 164 of the heat dissipation device 150 and backside surfaces 124 of the integrated circuit devices 120$_1$, 120$_2$, respectively.

Figure 7:
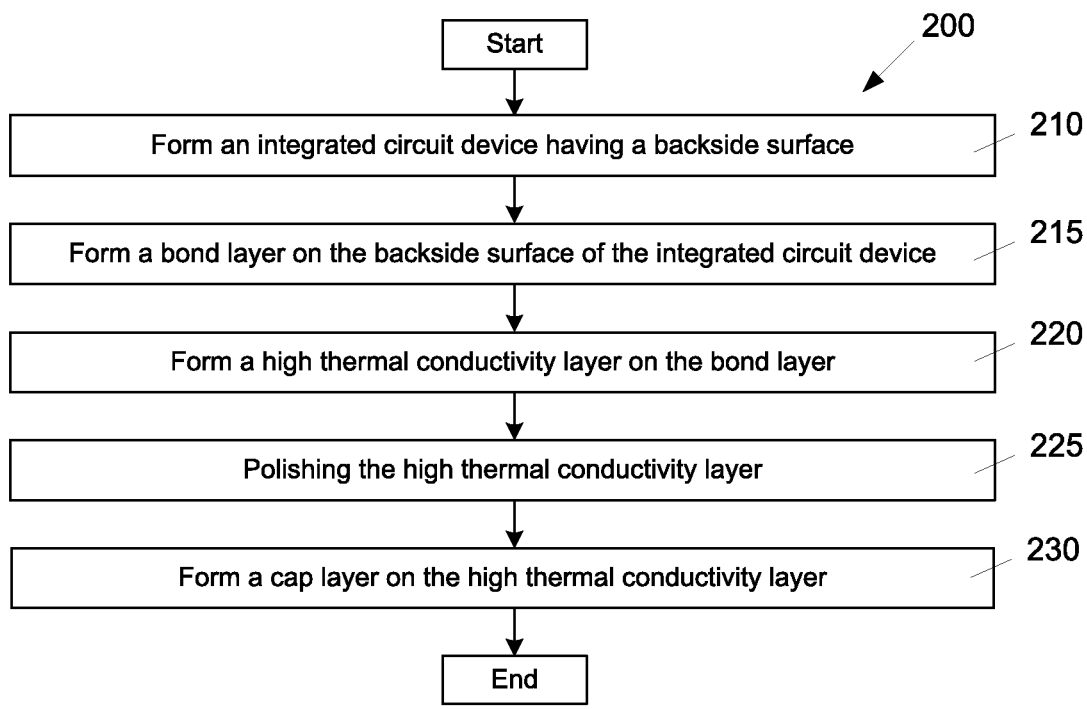
FIG. 7 is a flow chart of a process of fabricating an integrated circuit package, according to one embodiment of the present description.

FIG. 7 is a flow chart of a process 200 of fabricating an integrated circuit assembly according to an embodiment of the present description. As will be understood to those skilled in the art, the formation of the high thermal conductivity layer 184 (see FIG. 2) using high throughput additive manufacturing, such as coldspray, creates a relatively rough surface. Thus, the high thermal conductivity layer 184 (see FIG. 2) may be polished (such as grinding, chemical mechanical planarization, or other such polishing techniques), then the cap layer 186 (see FIG. 2) may be formed by a process that produces a smooth surface, such as physical vapor deposition. Thus, the process 200 is, as follows: As set forth in block 210, an integrated circuit device having a backside surface may be formed. A bond layer may be formed on the backside surface of the integrated circuit device, as set forth in block 215. As set forth in block 220, a high thermal conductivity layer may be formed on the bond layer. The thermal conductivity layer may be polished, as set forth in block 225. As set forth in block 230, a cap layer may be formed on the high thermal conductivity layer.

Figure 8:
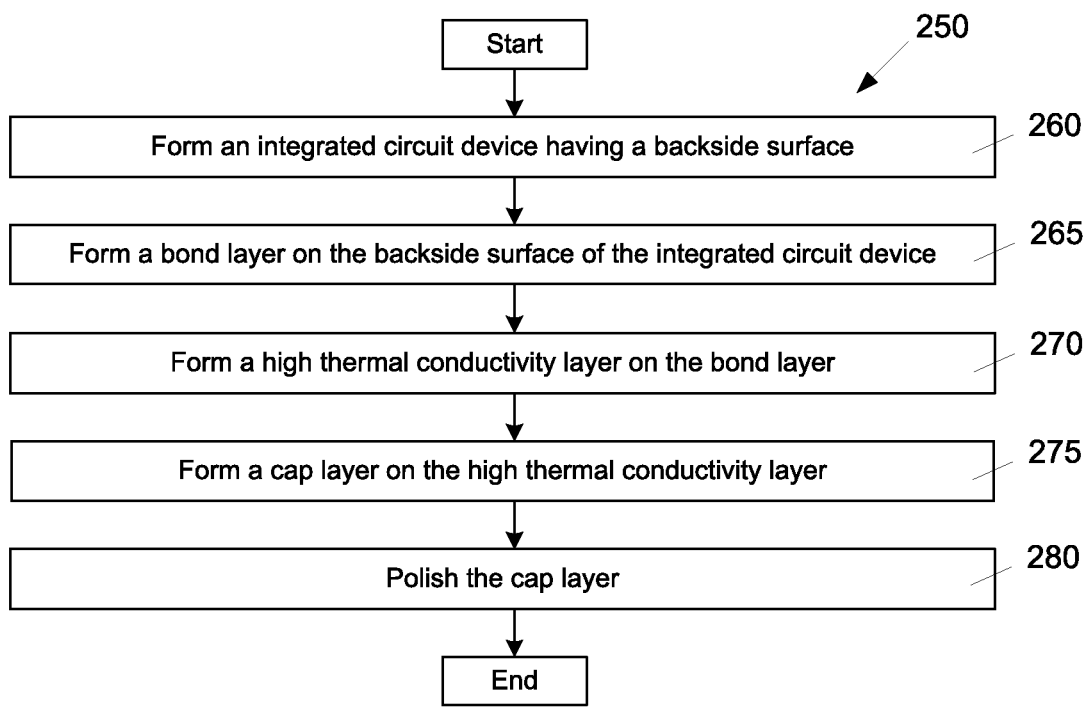
FIG. 8 is a flow chart of a process of fabricating an integrated circuit package, according to another embodiment of the present description.

FIG. 8 is a flow chart of a process 250 of fabricating an integrated circuit assembly according to an embodiment of the present description. The high thermal conductivity layer 184 (see FIG. 2) and the cap layer 186 (see FIG. 2) may be formed using high throughput additive manufacturing, such as coldspray, which creates relatively rough surfaces for both. Thus, the cap layer 186 (see FIG. 2) may be polished (such as grinding, chemical mechanical planarization, or other such polishing techniques) to a desired smoothness and thickness. Thus, the process 250 is, as follows: As set forth in block 260, an integrated circuit device having a backside surface may be formed. A bond layer may be formed on the backside surface of the integrated circuit device, as set forth in block 265. As set forth in block 270, a high thermal conductivity layer may be formed on the bond layer. A cap layer may be formed on the high thermal conductivity layer, as set forth in block 275. As set forth in block 280, the cap layer may be polished.

Each process has its own advantages and disadvantages. The process 200 of FIG. 7 allows the deposition of a thin cap layer 186 (see FIG. 2) that doesn't require polishing, which enables the use of a wider range of materials for the cap layer 186 (see FIG. 2) including ones that are difficult to polish, such as nickel or tungsten. The process 250 of FIG. 8, allows the use of the same equipment/module to create both the high thermal conductivity layer 184 (see FIG. 2) and the cap layer 186 (see FIG. 2).

Figure 9:
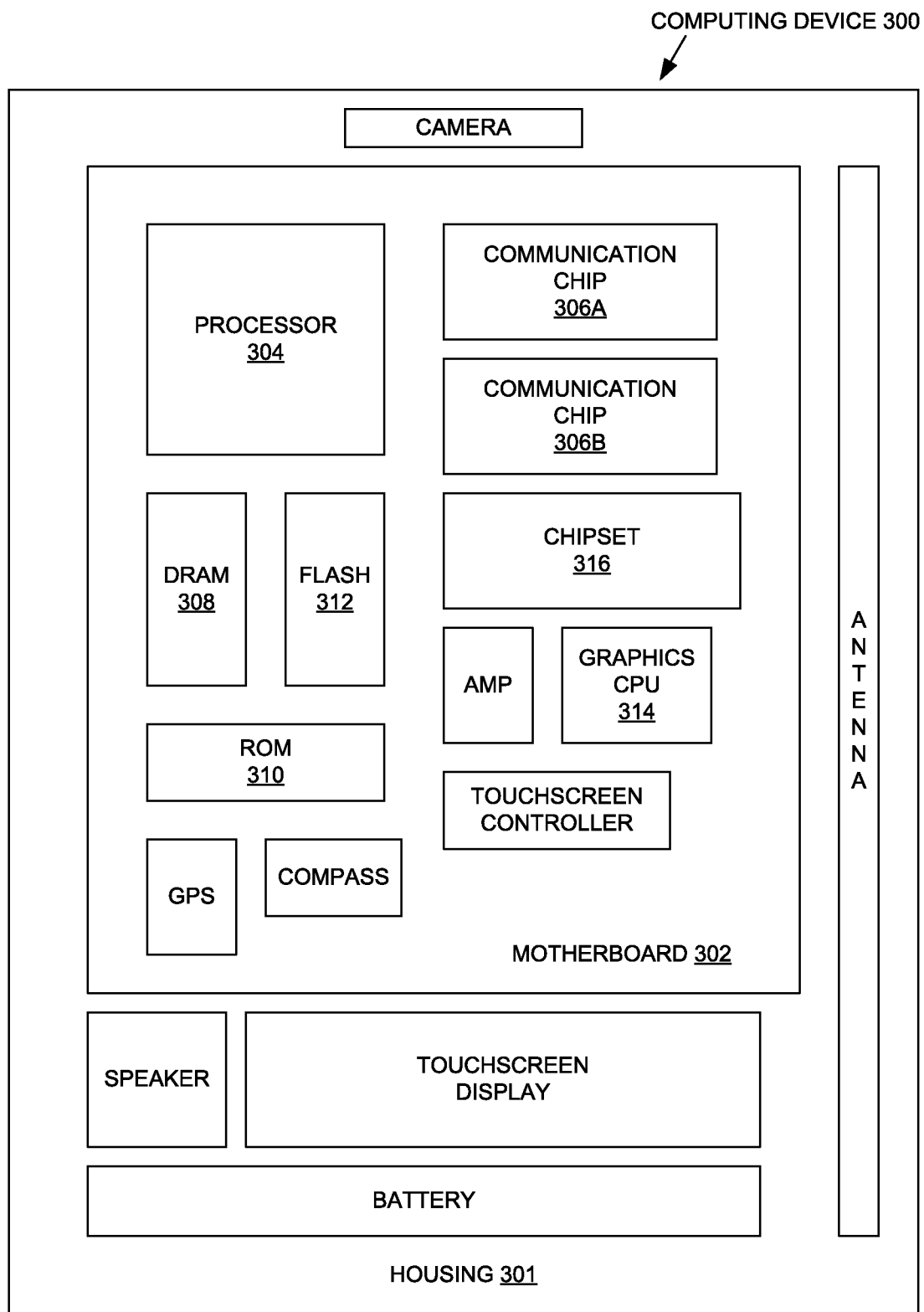
FIG. 9 is an electronic system, according to one embodiment of the present description.

FIG. 9 illustrates an electronic or computing device 300 in accordance with one implementation of the present description. The computing device 300 may include a housing 301 having a board 302 disposed therein. The computing device 300 may include a number of integrated circuit components, including but not limited to a processor 304, at least one communication chip 306A, 306B, volatile memory 308 (e.g., DRAM), non-volatile memory 310 (e.g., ROM), flash memory 312, a graphics processor or CPU 314, a digital signal processor (not shown), a crypto processor (not shown), a chipset 316, an antenna, a display (touchscreen display), a touchscreen controller, a battery, an audio codec (not shown), a video codec (not shown), a power amplifier (AMP), a global positioning system (GPS) device, a compass, an accelerometer (not shown), a gyroscope (not shown), a speaker, a camera, and a mass storage device (not shown) (such as hard disk drive, compact disk (CD), digital versatile disk (DVD), and so forth). Any of the integrated circuit components may be physically and electrically coupled to the board 302. In some implementations, at least one of the integrated circuit components may be a part of the processor 304.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

At least one of the integrated circuit components may include an integrated circuit assembly comprising an integrated circuit device having a backside surface, a bond layer on the backside surface on the integrated circuit device, a high thermal conductivity layer on the bond layer, and a cap layer on the high thermal conductivity layer.

In various implementations, the computing device may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

It is understood that the subject matter of the present description is not necessarily limited to specific applications illustrated in FIGS. 1-9. The subject matter may be applied to other integrated circuit devices and assembly applications, as well as any appropriate electronic application, as will be understood to those skilled in the art.

The following examples pertain to further embodiments and specifics in the examples may be used anywhere in one or more embodiments, wherein Example 1 is an integrated circuit assembly comprising an integrated circuit device having a backside surface, a bond layer on the backside surface on the integrated circuit device, a high thermal conductivity layer on the bond layer, and a cap layer on the high thermal conductivity layer.

In Example 2, the subject matter of Example 1 can optionally include the bond layer comprising a single layer of titanium.

In Example 3, the subject matter of Example 1 can optionally include the bond layer comprising a layered stack, wherein the layered stack comprises an adhesion promotion layer on the backside surface of the integrated circuit device and at least one metal layer on the adhesion layer.

In Example 4, the subject matter of Example 3 can optionally include the adhesion promotion layer comprising silicon nitride.

In Example 5, the subject matter of any of Examples 3 to 4 can optionally include the at least one metal layer comprising either titanium or a nickel/vanadium alloy.

In Example 6, the subject matter of any of Examples 3 to 4 can optionally include the at least one metal layer comprising a first metal layer on the adhesion promotion, wherein the first metal layer comprises titanium, and a second metal layer on the first metal layer, wherein the second metal layer comprises either gold, silver, or a nickel/vanadium alloy.

In Example 7, the subject matter of any of Examples 3 to 4 can optionally include the at least one metal layer comprising a first metal layer on the adhesion promotion, wherein the first metal layer comprises titanium, and a second metal layer on the first metal layer, wherein the second metal layer comprises a nickel/vanadium alloy, and a third metal layer on the second metal layer, wherein the third metal layer comprises gold or silver.

In Example 8, the subject matter of any of Examples 1 to 7 can optionally include the high thermal conductivity layer comprising at least one of copper, silver, aluminum, diamond, silicon carbide, boron nitride, aluminum nitride, and combinations thereof.

In Example 9, the subject matter of any of Example 1 to 8 can optionally include the cap layer comprising at least one of nickel, aluminum, silver, tungsten, vanadium, gold, titanium, and alloys thereof.

In Example 10, the subject matter of any of Example 1 to 9 can optionally include an electronic substrate, wherein a frontside surface of the integrated circuit device is electrically attached to the electronic substrate.

In Example 11, the subject matter of any of Example 1 to 10 can optionally include a heat dissipation device thermally attached to the cap layer through a thermal interface material.

Example 12 is an electronic system comprising an electronic board and an integrated circuit assembly attached to the electronic board, wherein the integrated circuit assembly comprises an electronic substrate having a first surface and an opposing second surface; and an integrated circuit device having a frontside surface and an opposing backside surface, and wherein the second surface of the electronic substrate is electrically attached to the first surface of the electronic board; a bond layer on the backside surface of the integrated circuit device; a high thermal conductivity layer on the bond layer; and a cap layer on the high thermal conductivity layer; and a heat dissipation device thermally attach to the cap layer through a thermal interface material.

In Example 13, the subject matter of Example 11 can optionally include the bond layer comprising a single layer of titanium.

In Example 14, the subject matter of Example 11 can optionally include the bond layer comprising a layered stack, wherein the layered stack comprises an adhesion promotion layer on the backside surface of the integrated circuit device and at least one metal layer on the adhesion layer.

In Example 15, the subject matter of Example 12 can optionally include the adhesion promotion layer comprising silicon nitride.

In Example 16, the subject matter of any of Examples 14 to 15 can optionally include the at least one metal layer comprising either titanium or a nickel/vanadium alloy.

In Example 17, the subject matter of any of Examples 14 to 15 can optionally include the at least one metal layer comprising a first metal layer on the adhesion promotion, wherein the first metal layer comprises titanium, and a second metal layer on the first metal layer, wherein the second metal layer comprises either gold, silver, or a nickel/vanadium alloy.

In Example 18, the subject matter of any of Examples 14 to 15 can optionally include the at least one metal layer comprising a first metal layer on the adhesion promotion, wherein the first metal layer comprises titanium, and a second metal layer on the first metal layer, wherein the second metal layer comprises a nickel/vanadium alloy, and a third metal layer on the second metal layer, wherein the third metal layer comprises gold or silver.

In Example 19, the subject matter of any of Examples 12 to 18 can optionally include the high thermal conductivity layer comprising at least one of copper, silver, aluminum, diamond, silicon carbide, boron nitride, aluminum nitride, and combinations thereof.

In Example 20, the subject matter of any of Example 12 to 19 can optionally include the cap layer comprising at least one of nickel, aluminum, silver, tungsten, vanadium, gold, titanium, and alloys thereof.

Example 21 is a method of fabricating an integrated circuit assembly comprising forming an integrated circuit device having a backside surface, forming a bond layer on the backside surface of the integrated circuit device, forming a high thermal conductivity layer on the bond layer, and forming a cap layer on the high thermal conductivity layer.

In Example 22, the subject matter of Example 21 can optionally include polishing the thermal conductivity layer prior to forming the cap layer.

In Example 23, the subject matter of Example 21 can optionally include polishing the cap layer.

In Example 24, the subject matter of any of Examples 21 to 23 can optionally include forming the bond layer comprising forming a single layer of titanium.

In Example 25, the subject matter of any of Examples 21 to 23 can optionally include forming the bond layer comprising forming a layered stack, wherein the layered stack comprises an adhesion promotion layer on the backside surface of the integrated circuit device and at least one metal layer on the adhesion layer.

In Example 26, the subject matter of Example 25 can optionally include the adhesion promotion layer comprising silicon nitride.

In Example 27, the subject matter of any of Examples 25 to 26 can optionally include the at least one metal layer comprising either titanium or a nickel/vanadium alloy.

In Example 28, the subject matter of any of Examples 25 to 26 can optionally include the at least one metal layer comprising a first metal layer on the adhesion promotion, wherein the first metal layer comprises titanium, and a second metal layer on the first metal layer, wherein the second metal layer comprises either gold, silver, or a nickel/vanadium alloy.

In Example 29, the subject matter of any of Examples 25 to 26 can optionally include the at least one metal layer comprising a first metal layer on the adhesion promotion, wherein the first metal layer comprises titanium, and a second metal layer on the first metal layer, wherein the second metal layer comprises a nickel/vanadium alloy, and a third metal layer on the second metal layer, wherein the third metal layer comprises gold or silver.

In Example 30, the subject matter of any of Examples 21 to 29 can optionally include forming the high thermal conductivity layer comprising forming the high thermal conductivity layer from at least one of copper, silver, aluminum, diamond, silicon carbide, boron nitride, aluminum nitride, and combinations thereof.

In Example 31, the subject matter of any of Example 21 to 30 can optionally include forming the cap layer comprising forming the cap layer from at least one of nickel, aluminum, silver, tungsten, vanadium, gold, titanium, and alloys thereof.

In Example 32, the subject matter of any of Example 21 to 31 can optionally include forming an electronic substrate and electrically attaching a frontside surface of the integrated circuit device to the electronic substrate.

In Example 33, the subject matter of any of Example 21 to 32 can optionally include thermally attaching a heat dissipation device to the cap layer through a thermal interface material.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:
1. An integrated circuit assembly, comprising:
an integrated circuit device having a backside surface;

a material stack on the backside surface, wherein the material stack comprises:
  a first layer comprising silicon and nitrogen, the first layer in direct contact with the backside surface of the integrated circuit device;
  a second layer in direct contact with the first layer, wherein the second layer comprises a first metal;
  a third layer over the second layer, wherein the third layer comprises at least one of copper, silver, aluminum, diamond, silicon carbide, boron nitride, or aluminum nitride, and wherein the third layer has thickness of at least 50 µm and a thermal conductivity greater than 150 W/m*K; and
  a fourth layer in direct contact with the third layer, wherein the fourth layer comprises a second metal; and
a heat dissipation device over the material stack, wherein the heat dissipation device extends beyond an edge of the backside surface and beyond an edge of the material stack; and
a thermal interface material between the heat dissipation device and the material stack.

2. The integrated circuit assembly of claim 1, wherein the second layer comprises a layer of titanium.

3. The integrated circuit assembly of claim 1, wherein the second layer comprises a layer of a nickel/vanadium alloy.

4. The integrated circuit assembly of claim 3, wherein the first layer is a layer of silicon nitride.

5. The integrated circuit assembly of claim 3, wherein the second layer comprises a layer of either titanium or a nickel/vanadium alloy.

6. The integrated circuit assembly of claim 3, wherein the second layer comprises a layer of titanium in direct contact with the first layer, and a layer of either gold or a nickel/vanadium alloy in direct contact with the layer of titanium.

7. The integrated circuit assembly of claim 3, wherein the second layer comprises a layer of titanium in direct contact with the first layer, and a layer of nickel/vanadium alloy over the layer of titanium, and a layer of gold over the layer of nickel/vanadium alloy.

8. The integrated circuit assembly of claim 1, wherein the fourth layer has a thickness less than 10 microns.

9. The integrated circuit assembly of claim 1, wherein the second metal is nickel, aluminum, silver, tungsten, vanadium, gold, titanium, or an alloy thereof.

10. The integrated circuit assembly of claim 1, wherein the thermal interface material is a thermal grease, a thermal gap pad, a polymer, an epoxy filled with high thermal conductivity fillers.

11. An electronic system, comprising:
an electronic board; and
an integrated circuit assembly electrically attached to the electronic board, wherein the integrated circuit assembly comprises:
  an electronic substrate having a first surface and an opposing second surface;
  a first integrated circuit device having a frontside surface and an opposing backside surface, wherein the frontside surface of the first integrated circuit device is electrically attached to the first surface of the electronic substrate, and wherein the second surface of the electronic substrate is electrically attached to the first surface of the electronic board;
  a first material stack of a first thickness on the backside surface of the first integrated circuit device, wherein the first material stack comprises a bulk layer between a first layer comprising a first metal and a second layer comprising a second metal, wherein the bulk layer comprises at least one of copper, silver, aluminum, diamond, silicon carbide, boron nitride, or aluminum nitride, and wherein the bulk layer has a thickness of at least 50 µm and a thermal conductivity greater than 150 W/m*K;
  a second integrated circuit device adjacent to the first integrated circuit device, the second integrated circuit device having a frontside surface electrically attached to the first surface of the electronic substrate;
  a second material stack of a second thickness on a backside surface of the second integrated circuit device, wherein the second material stack comprises the bulk layer between the first layer comprising the first metal and the second layer comprising the second metal, and wherein the second thickness differs from the first thickness by an amount that compensates for a difference in heights of the first and second integrated circuit devices as measured from the first surface of the electronic substrate to the backside surface of each of the first and second integrated circuit devices; and
  a heat dissipation device spanning, and thermally coupled to, each of the first and second material stacks through a thermal interface material.

12. The electronic system of claim 11, wherein the bond layer first layer is a single layer of titanium.

13. The electronic system of claim 11, wherein the first layer comprises a layered stack including at least one metal layer.

14. The electronic system of claim 13, wherein the first layer comprises a layer of silicon nitride in direct contact with the backside surface of the first and second integrated circuit devices, and wherein the at least one metal layer is in direct contact with the layer of silicon nitride.

15. The electronic system of claim 13, wherein the at least one metal layer comprises is either a layer of titanium or a layer of a nickel/vanadium alloy.

16. The electronic system of claim 13, wherein the at least one metal layer comprises a layer of titanium, and a layer of either gold or a nickel/vanadium alloy in direct contact with the layer of titanium.

17. The electronic system of claim 13, wherein the at least one metal layer comprises a layer of titanium, a layer of a nickel/vanadium alloy over the layer titanium, and a layer of gold over the layer of nickel/vanadium.

18. The electronic system of claim 11, wherein the bulk layer has a thickness less than 10 microns.

19. The electronic system of claim 11, wherein the second metal is at least one of nickel, aluminum, silver, tungsten, vanadium, gold, titanium, and alloys thereof.

20. The electronic system of claim 11, wherein the thermal interface material is a thermal grease, a thermal gap pad, a polymer, an epoxy filled with high thermal conductivity fillers.

21. The electronic system of claim 11, wherein a thickness of the thermal interface material between the heat dissipation device and the first integrated circuit device is substantially equal to a thickness of the thermal interface material between the heat dissipation device and the second integrated circuit device.

* * * * *